United States Patent
Han et al.

(10) Patent No.: US 9,922,846 B2
(45) Date of Patent: Mar. 20, 2018

(54) METHOD OF MANUFACTURING SEMICONDUCTOR PACKAGE

(71) Applicant: Samsung Electronics Co., Ltd., Suwon-si (KR)

(72) Inventors: Seong-chan Han, Cheonan-si (KR); Young-rock Lee, Anan-si (KR); Chang-kun Kang, Seoul (KR); Chil-hoon Lee, Cheonan-si (KR); Han-ju Kim, Anan-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/286,828

(22) Filed: Oct. 6, 2016

(65) Prior Publication Data
US 2017/0103906 A1    Apr. 13, 2017

(30) Foreign Application Priority Data
Oct. 7, 2015 (KR) .................. 10-2015-0141050

(51) Int. Cl.
*H01L 21/56* (2006.01)
*H01L 21/48* (2006.01)
(Continued)

(52) U.S. Cl.
CPC ........ *H01L 21/563* (2013.01); *H01L 21/4853* (2013.01); *H01L 24/13* (2013.01); *H01L 24/16* (2013.01); *H01L 24/32* (2013.01); *H01L 24/73* (2013.01); *H01L 24/92* (2013.01); *H01L 25/0655* (2013.01); *H01L 25/16* (2013.01); *H01L 2224/131* (2013.01); *H01L 2224/16227* (2013.01); *H01L 2224/26175* (2013.01); *H01L 2224/32225* (2013.01); *H01L 2224/48227* (2013.01); *H01L 2224/73204* (2013.01); *H01L 2224/92125* (2013.01); *H01L 2924/1579* (2013.01); *H01L 2924/15323* (2013.01);
(Continued)

(58) Field of Classification Search
CPC .............. H01L 2224/83051; H01L 21/563
See application file for complete search history.

(56) References Cited

U.S. PATENT DOCUMENTS

| 6,400,036 B1 | 6/2002 | Tang et al. |
| 7,087,994 B2 | 8/2006 | Lee |
(Continued)

FOREIGN PATENT DOCUMENTS

| JP | 4985528 | 7/2012 |
| KR | 10-2008-0029747 | 4/2008 |
| KR | 10-0886446 | 3/2009 |

*Primary Examiner* — Yu-Hsi D Sun
(74) *Attorney, Agent, or Firm* — Muir Patent Law, PLLC

(57) ABSTRACT

A method of manufacturing a semiconductor package includes preparing a package substrate including a semiconductor chip mounting region. A semiconductor chip is mounted in the semiconductor chip mounting region. A dam surrounding the semiconductor chip is formed. The formation of the dam includes depositing a first solution having a temperature below a set first temperature. A region under the semiconductor chip and a region defined by the dam are filled with an underfill by depositing the first solution having a temperature equal to or higher than the set first temperature.

25 Claims, 15 Drawing Sheets

(51) Int. Cl.
*H01L 23/00* (2006.01)
*H01L 25/065* (2006.01)
*H01L 25/16* (2006.01)

(52) U.S. Cl.
CPC ............ *H01L 2924/15787* (2013.01); *H01L 2924/15788* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 7,569,419 B2 * | 8/2009 | Shizuno | H01L 21/563 257/E21.503 |
| 8,143,110 B2 | 3/2012 | Karpur et al. | |
| 8,399,305 B2 | 3/2013 | Huang et al. | |
| 8,828,806 B2 | 9/2014 | Sumita | |

* cited by examiner

METHOD OF MANUFACTURING SEMICONDUCTOR PACKAGE

CROSS-REFERENCE TO RELATED APPLICATION

This application claims priority under 35 USC § 119(a) to the Korean Patent Application No. 10-2015-0141050, filed on Oct. 7, 2015, in the Korean Intellectual Property Office, the disclosure of which is incorporated herein in its entirety by reference.

BACKGROUND

The present disclosure relates to a method of manufacturing a semiconductor package, and more particularly, to a method of manufacturing a semiconductor package by using a process of spraying an underfill on a package substrate on which a semiconductor chip is mounted.

With the miniaturization and an increase in the functionality of electronic products, a high-density mounting process has become useful for a packaging technique of mounting a semiconductor device on a package substrate. Thus, various types of techniques of mounting semiconductor devices have been proposed. When a semiconductor device is mounted on a printed circuit board (PCB), a gap between the semiconductor device and the PCB may be filled with an underfill to ensure connection reliability between the PCB and the semiconductor device. When the underfill, which may be a liquid resin, is deposited (e.g., sprayed) between the PCB and the semiconductor device, a small amount of the underfill may overflow into a peripheral region surrounding the semiconductor device. However, with recent developments of electronic products, there are tendencies to mount a semiconductor device on a PCB at high integration density and also to mount an electronic device and a circuit pattern in the peripheral region at high integration density. Therefore, when the underfill overflows and reaches the electronic device and the circuit pattern located in the peripheral region, the electronic device and the circuit pattern may be contaminated with the underfill so that failures may occur in the electronic products.

SUMMARY

The disclosure provides a method of manufacturing a semiconductor package, which may prevent the outflow of an underfill by controlling a process of spraying the underfill, so that failures in the semiconductor package may be reduced and connection reliability may be increased.

Aspects of the disclosure should not be limited by the above description, and other unmentioned aspects will be clearly understood by one of ordinary skill in the art from example embodiments described herein.

According to exemplary embodiments, a method of manufacturing a semiconductor package is provided. The method includes preparing a package substrate including a semiconductor chip mounting region, mounting a semiconductor chip in the semiconductor chip mounting region, forming a dam surrounding the semiconductor chip by depositing a first solution having a temperature below a set first temperature, and filling a region under the semiconductor chip and a region defined by the dam with an underfill by depositing the first solution having a temperature equal to or higher than the set first temperature.

In some embodiments, the set first temperature is temperature that may range from about 40° C. to about 50° C.

In some embodiments, a viscosity of the first solution used for forming the dam at the temperature below the set temperature may be higher than a viscosity of the first solution used for filling the region under the semiconductor chip and the region defined by the dam with the underfill at the temperature equal to or higher than the set first temperature.

In some embodiments, the first solution may be deposited via a nozzle. A diameter of a first nozzle configured to deposit the first solution at the temperature below the set first temperature may be smaller than a diameter of a second nozzle configured to deposit the first solution at the temperature equal to or higher than the set first temperature.

According to an exemplary embodiment, the first nozzle may deposit the first solution and form the dam such that a start point of the dam contacts an end point thereof.

In some embodiments, a plurality of second nozzles may be provided, and the method may further include simultaneously depositing the first solution via at least one of the plurality of second nozzles.

In some embodiments, the method may include depositing the first solution between the semiconductor chip and the dam via at least one of the plurality of second nozzles, and depositing the first solution between the semiconductor chips via the remaining second nozzles.

In an exemplary embodiment, the dam may be spaced apart from the semiconductor chip.

In some embodiments, after filling the region under the semiconductor chip and the region defined by the dam with the underfill, the method may further include curing the dam and the underfill.

In some embodiments, the curing of the dam and the underfill may include applying a constant second temperature to the dam and the underfill simultaneously.

In some embodiments, the constant second temperature has a value in a range from about 60° C. to about 80° C.

In some embodiments, the viscosity of the first solution is inversely proportional to the temperature of the first solution when the temperature of the first solution ranges from about 30° C. and about 70° C.

In some embodiments, when the set first temperature is about 40° C. and the temperature of first solution is between about 39° C. and about 30° C., the viscosity of the first solution is a value that ranges from about 1571.5 mPa·s to about 2125 mPa·s.

In some embodiments, the first solution includes about 40% by weight epoxy resin and about 10% by weight silicone.

According to another aspect of the disclosed embodiments, a method of manufacturing a semiconductor package is disclosed. The method includes preparing a package substrate having a semiconductor chip mounting region, the package substrate including a substrate pad formed inside of the semiconductor chip mounting region of the package substrate, forming a dam surrounding the semiconductor chip mounting region, wherein the forming of the dam includes using a first solution while a viscosity of the first solution is equal to or higher than a set first viscosity, mounting a semiconductor chip in the semiconductor chip mounting region, wherein the mounting of the semiconductor chip includes electrically connecting the semiconductor chip to the substrate pad, filling the region under the semiconductor chip and a region defined by the dam with an underfill by using the first solution while the viscosity of the first solution is below the set first viscosity, and simultaneously curing the dam and the underfill.

In some embodiments, the set first viscosity may range from about 1000 mPa·s to about 1500 mPa·s, and the viscosity of the first solution may vary according to temperature.

In some embodiments, the first solution may include a material containing at least one selected from the group consisting of an epoxy resin, a phenol resin, and a silicone-based material.

According to an exemplary embodiment, the dam may include at least one closed curve.

According to an exemplary embodiment, the filling of the region under the semiconductor chip and a region defined by the semiconductor chip may include filling the at least one closed curve with the underfill.

In some embodiments, the method of manufacturing the semiconductor package may include: forming the dam surrounding the semiconductor chip by using the first solution having a temperature below a set first temperature; and filling the region under the semiconductor chip and a region defined by the dam with the underfill by using the first solution having a temperature equal to or higher than the set first temperature.

In some embodiments, a method of manufacturing a semiconductor package is disclosed. The method may include: preparing a package substrate having a semiconductor chip mounting region, the package substrate including a substrate pad formed inside of the semiconductor chip mounting region of the package substrate; forming a raised portion to surround the semiconductor chip mounting region, wherein the forming of the raised portion includes depositing a first solution while a temperature of the first solution is lower than a set first temperature and while a viscosity of the first solution is equal to or higher than a set first viscosity; mounting a semiconductor chip in the semiconductor chip mounting region, wherein the mounting of the semiconductor chip includes electrically connecting the semiconductor chip to the substrate pad; and filling a region under the semiconductor chip and a region defined by the raised portion with an underfill by depositing the first solution while the temperature of the first solution is equal to or higher than the set first temperature and while the viscosity of the first solution is below the set first viscosity.

In some embodiments, the method may include simultaneously curing the raised portion and the underfill by applying a constant second temperature higher than the set first temperature.

In some embodiments, the set first viscosity has a value in a range from about 1000 mPa·s to about 1500 mPa·s.

In some embodiments, the set first temperature has a value in a range from bout 40° C. to about 50° C.

BRIEF DESCRIPTION OF THE DRAWINGS

Embodiments will be more clearly understood from the following detailed description taken in conjunction with the accompanying drawings in which:

FIGS. 1A to 4A and 1B to 4B are plan views and side views of a method of manufacturing a semiconductor package according to exemplary embodiments;

DETAILED DESCRIPTION OF THE EMBODIMENTS

Figure 1A:
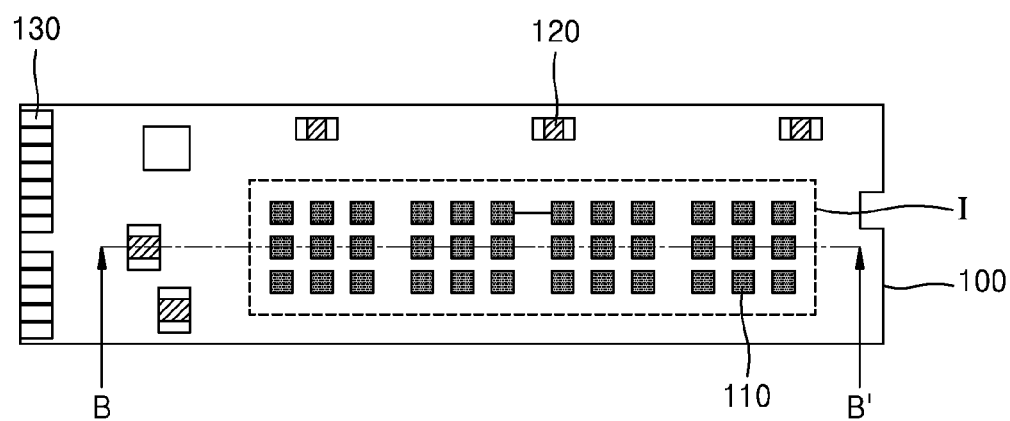

This exemplary disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" or "in contact with" another element, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs.

Unless expressly mentioned otherwise, a vertical direction and a horizontal direction used herein refer to a vertical direction and a horizontal direction with respect to a main surface of a package substrate (e.g., top or bottom surface). Also, unless expressly mentioned otherwise, a top surface of a component stacked on the package substrate refers to a surface facing away from the package substrate, while a bottom surface of the component refers to a surface facing the package substrate.

As used herein, a temperature below a set first temperature is synonymous with a low temperature, and a temperature equal to or higher than the set first temperature is synonymous with a high temperature. Also, a viscosity below a set first viscosity is synonymous with a low viscosity, and a viscosity equal to or higher than the set first viscosity is synonymous with a high viscosity. The set first temperature and the set first viscosity may depend on a kind of a first solution used in an exemplary embodiment.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Unless otherwise noted herein, spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning. For example consistent with their meaning in the context of the relevant art and/or this exemplary application, and will not be interpreted in an idealized or overly formal sense unless expressly so defined herein.

FIGS. 1A to 4B are plan views and side views of a method of manufacturing a semiconductor package according to an exemplary embodiment.

Figure 1B:
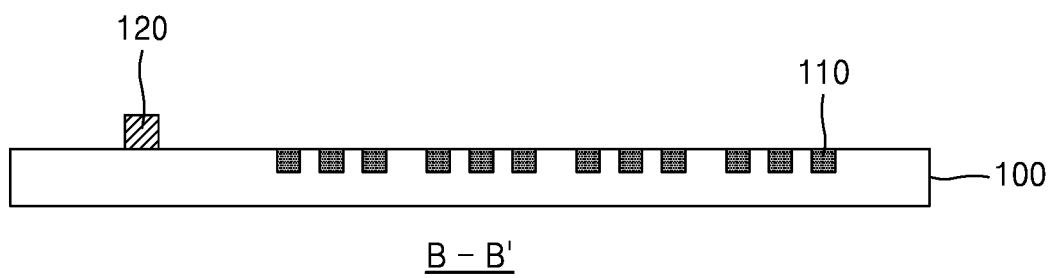

Referring to FIGS. 1A and 1B, the method of manufacturing the semiconductor package according to one exemplary embodiment may include preparing a package substrate 100 including a semiconductor chip mounting region I and a peripheral region surrounding the semiconductor chip mounting region I.

In some embodiments, the package substrate 100 may be a support substrate and include a body layer, a lower protection layer, and an upper protection layer. The package substrate 100 may be formed based on, for example, a printed circuit board (PCB), a ceramic substrate, a glass substrate, or an interposer substrate. In an exemplary embodiment, the package substrate 100 may be a PCB. However, the package substrate 100 is not limited to the PCB.

Figure 2A:
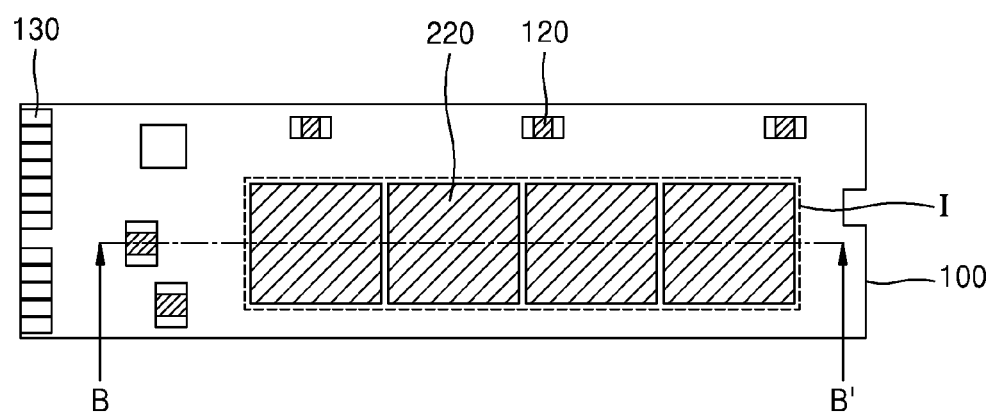

In some embodiments, interconnections may be formed in the package substrate 100 and electrically connected to a semiconductor chip (e.g., the semiconductor chip 220 as illustrated in FIG. 2A) by using, for example, solder balls, a wire bonding process, or a flip-chip bonding process. In an exemplary embodiment, external connection terminals 130 may be located in the peripheral region of the package substrate 100, e.g., in the region surrounding the chip mounting region I. The package substrate 100 may be electrically connected to and mounted on a module substrate or a system board by using the external connection terminals 130. The external connection terminals may be formed of a metal or other conductive material.

According to an exemplary embodiment, a multi-layered interconnection pattern or a single interconnection pattern may be formed in the body layer, and the external connection terminals 130 may be electrically connected to substrate pads 110 by using the interconnection pattern. The substrate pads, may be, for example, interconnection terminals formed of a conductive material, such as a metal, for transmitting signals to and from the package substrate (e.g., to a chip mounted on the substrate, or from the chip). The substrate pads may have a flat upper surface, and may be formed in the package substrate 100, as depicted in FIG. 1B.

The lower protection layer and the upper protection layer may serve to protect the body layer and include, for example, solder resist (SR).

In an alternative embodiment, when the package substrate 100 is a PCB, the formation of the body layer may include forming a thin layer by compressing a polymer material (e.g., a thermosetting resin), an epoxy-based resin (e.g., Frame Retardant 4 (FR-4), bismaleimide triazine (BT), and Ajinomoto build-up film (ABF)), or a phenol resin to a predetermined thickness, coating both surfaces of the thin layer with copper foil, and forming interconnection patterns serving as paths for transmitting electric signals by using a patterning process. Also, the interconnection patterns formed on a lower surface and an upper surface of the body layer may be electrically connected to each other through a via contact (e.g., a conductive via) penetrating the body layer. In some embodiments, the entire lower and upper surfaces of the body layer except terminal connection portions (e.g., the substrate pad 110 and the external connection terminals 130) may be coated with a solder resist to form a lower protection layer and an upper protection layer.

In some embodiments, PCBs may be classified into a single-layer PCB having a single layer on which an interconnection is formed and a double-layer PCB having two layers on which interconnections are respectively formed. Also, copper foil having at least three layers may be formed by using an insulator called a prepreg, and at least three interconnection layers may be formed according to the number of layers of the copper foil to form a PCB having a multilayered interconnection structure. In the method of manufacturing the semiconductor package according to this exemplary embodiment, the package substrate 100 is not limited to the above-described structures or materials of PCBs.

In some embodiments, an electrode device, for example, a passive device 120, such as a capacitor, an inductor, or a resistor, may be formed in the peripheral region surrounding the semiconductor chip mounting region I. A memory module may use the passive device 120 to smoothly transmit signals to the semiconductor package. For example, a resistor may serve to reduce noise of signal waves, and a capacitor may act as a decoupling capacitor.

Figure 2B:
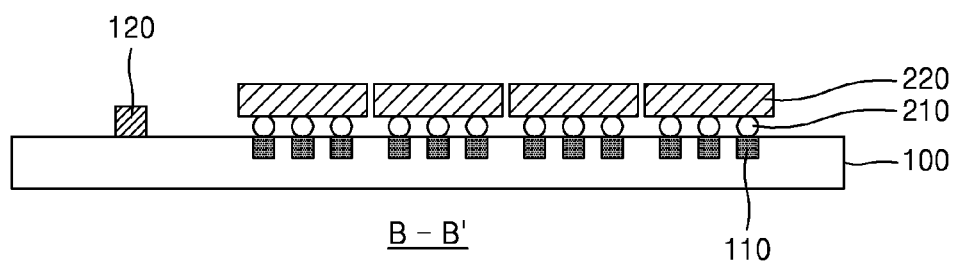

Referring to FIGS. 2A and 2B, according to an exemplary embodiment, a semiconductor chip 220 may be mounted on a semiconductor chip mounting region I of the package substrate 100. The semiconductor chip 220 may include an active surface and an inactive surface. The semiconductor chip 220 may be mounted on the package substrate 100 by using an electrical connection member (e.g., a connection member 210) prepared on the active surface of the semiconductor chip 220.

In some embodiments, the semiconductor chip 220 may include a body unit, an interconnection portion, and a protection layer. The semiconductor chip 220 may be formed based on, for example, an active wafer. When the semiconductor chip 220 is formed based on the active wafer, the body unit may include a semiconductor substrate, an integrated circuit (IC) layer, and an interlayer insulating layer. In some embodiments, the interconnection portion located on the body unit may include an intermetal dielectric (IMD) and a multi-layered interconnection structure located in the IMD.

In some embodiments, the semiconductor substrate on which the body unit is based may include a Group IV material wafer (e.g., a silicon wafer) or a Group III-V compound wafer. The semiconductor substrate may be formed by using a single crystalline wafer, such as a silicon single crystalline wafer, in terms of a forming method. However, the semiconductor substrate is not limited thereto the single crystalline wafer but may be formed by using one of various wafers, such as an epitaxial wafer, a polished wafer, an annealed wafer, or a silicon on insulator (SOI) wafer. In this embodiment, the epitaxial wafer may refer to a wafer formed by growing a crystalline material on a single crystalline silicon substrate.

Although not shown, the protection layer may be formed on the interconnection portion toward the active surface of the semiconductor chip 220. The protection layer may function to prevent the semiconductor chip 220 from being externally physically and chemically damaged. The protection layer may include, for example, an oxide layer, a nitride layer, or a double layer of an oxide layer and a nitride layer. Also, the protection layer may be formed of an oxide layer or a nitride layer (e.g., a silicon oxide ($SiO_2$) layer, a silicon nitride (SiNx) layer, or a combination thereof) by using a high-density plasma-chemical vapor deposition (HDP-CVD) process.

A plurality of connection members 210 may be formed on an active surface of the semiconductor chip 220. Each of the connection members 210 may be electrically connected to the substrate pad 110. The connection member 210 may include, for example, only a solder ball, a copper pillar, or both the copper pillar and the solder ball. The connection member 210 may include conductive bumps. For example, the connection member 210 may be electrically connected to electrically conductive components of both the semiconductor chip 220 and the package substrate 100, for example, to connect integrated circuits of the semiconductor chip 220 to circuits and/or conductive lines of the package substrate 100. However, the connection member 210 is not limited thereto.

In some descriptions, the term "connection terminal" may be used to refer to any of external connection terminals 130 or connection members 210. The term "conductive terminal" may be used to refer to these terminals or connectors such as a bonding pad or ball land. Connection members 210 may be more specifically referred to as internal package terminals or internal package interconnection terminals. Connection members 210 may connect items of the package substrate 100 to items of the semiconductor chip 220 and thus may be internal package interconnection terminals. The external connection terminals 130 may be more specifically referred to as external package terminals. The external terminals 130 may connect the semiconductor package to another device, such as a module board or other board, for example. Items described as pads or ball lands herein may have substantially flat surfaces, while items described as balls or bumps herein may have curved surfaces.

The semiconductor chip 220 may include a memory device or a non-memory device. The memory device may include, for example, dynamic random access memory (DRAM), static RAM (SRAM), flash memory, electrically erasable and programmable read-only memory (EEPROM), phase-change (PRAM), magnetic RAM (MRAM), and/or resistive RAM (RRAM). The non-memory device may include, for example, a logic device (e.g., a photoelectronic device, a communication device, a microprocessor (MP), a digital signal processor (DSP), a microcontroller (MC), a system-on-chip, or a similar device thereto.

The semiconductor package may include a plurality of semiconductor chips 220 (e.g., horizontally adjacent to each other, and/or stacked on each other). As used herein, the singular forms "a", "an" and "the" should be interpreted as including the plural forms as well unless the context clearly indicates otherwise.

Figure 3A:
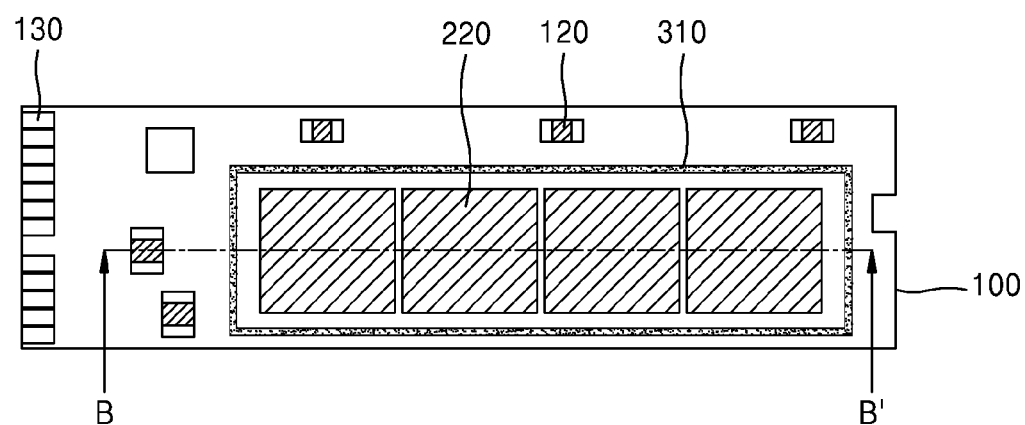
Figure 3B:
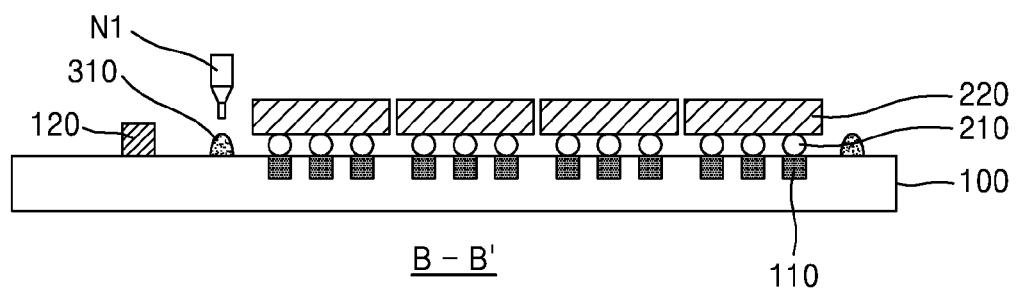
Figure 4A:
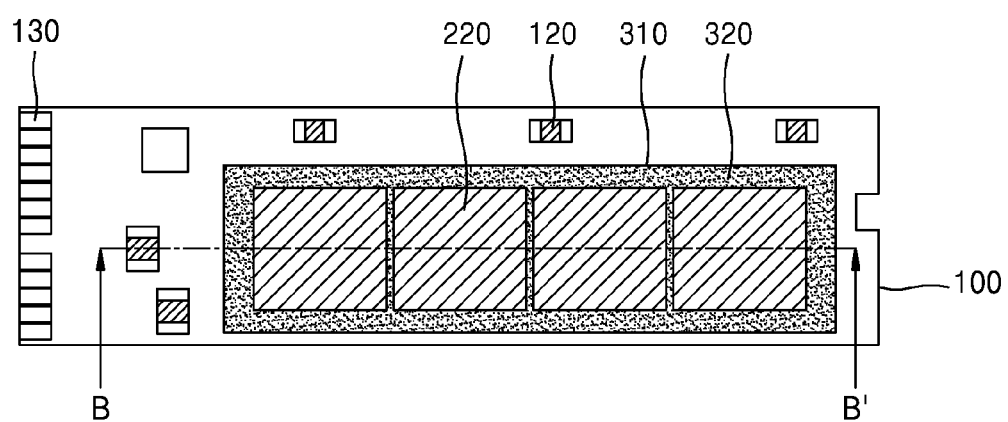

In some embodiments, referring to FIGS. 3A and 3B, a dam 310 surrounding the semiconductor chip mounting region I may be formed by depositing (e.g., spraying) a first solution having a low temperature (e.g., a temperature lower than about 50° C.) via a first nozzle N1. In some embodiment, the temperature of the solution may be different from the temperature of the atmosphere surrounding the semiconductor package. The dam 310 may be formed as a raised portion (e.g., having a desired height in a first direction and a width in a second direction) surrounding the semiconductor chip mounting region I after spraying the first solution having a low temperature via a first nozzle N1 for several times. In some embodiments, the temperature of the first solution may be in the range of about 30° C. to about 40° C. Since a plurality of passive devices 120 and a plurality of external connection terminals 130 are formed in the vicinity of the semiconductor chip 220 and surround the semiconductor chip 220, in the this exemplary embodiment, the dam 310 may surround the semiconductor chip mounting region I to prevent an underfill (e.g., underfill 320 as illustrated in FIG. 4A) from undesirably overflowing into the passive devices 120 and the external connection terminals 130.

Figure 4B:
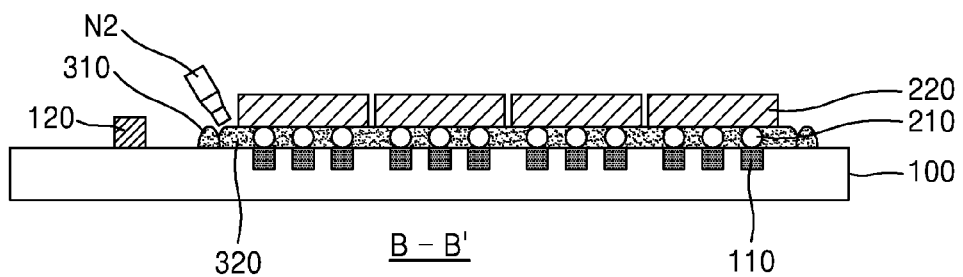
Figure 5A:
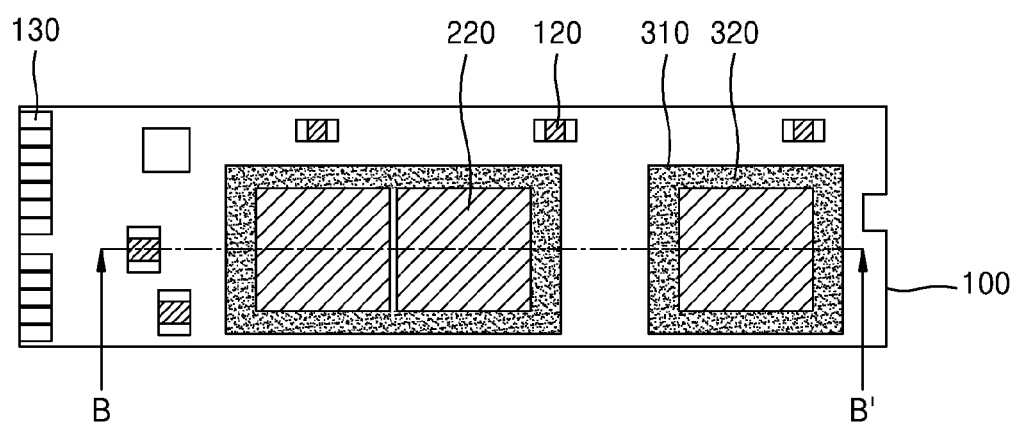
FIGS. 5A and 5B and a plan view and a side view of a method of manufacturing a semiconductor package according to exemplary embodiments.

In this exemplary embodiment, when the dam 310 is formed between the semiconductor chip mounting region I and the passive device 120, the dam 310 may be formed at a predetermined distance apart from the semiconductor chip mounting region I so that the dam 310 and the semiconductor chip 220 may not interfere with a second nozzle N2 (as illustrated in FIG. 4B) during a subsequent process of spraying the underfill via the second nozzle N2. Also, a start point of the dam 310 may contact an end point thereof so that the underfill may not flow out from the dam 310. For example, the dam 310 may have a closed curve-shaped structure. However, the dam 310 is not limited to this curve-shaped structure. For example, in some embodiments, the dam 310 may have a closed rectangular-shaped or closed square-shaped structure (e.g., as illustrated in FIG. 5A).

The dam 310 configured to prevent the overflow of the underfill may be formed by spraying a first solution having a low-temperature (e.g., a temperature lower than about 40° C. or about 50° C., but not limited thereto) via the first nozzle N1. In some embodiments, a diameter of the first nozzle N1 may be smaller than a diameter of the second nozzle N2. For example, the dam 310 may be formed to a fine size by controlling the spraying of the first solution using the first nozzle N1 having a relatively smaller diameter than the second nozzle N2. The dam 310 may be formed by spraying the first solution to the same location several times depending on a desired thickness and width.

In some embodiments, the first solution may include a material containing at least one selected from the group consisting of an epoxy resin, a phenol resin, and a silicone-based material. The first solution may contain about 40% by weight epoxy resin and about 10% by weight silicone. For example, in the first solution, a ratio of epoxy resin to silicone may be about 4 to 1. The first solution according to this exemplary embodiment is not limited thereto and may be used without any particular limitation when materials included in the first solution may be sprayed via the first nozzle N1. The first solution may be used as a material for forming the dam 310 and the underfill. For example, the dam 310 and the underfill may be formed by using the same material.

The first solution will now be described with reference to FIG. 7. In some embodiments, the first solution may be a material of which viscosity greatly varies according to a temperature. For example, the viscosity of the first solution may be inversely proportional to the temperature of the first solution when the temperature of the first solution ranges from about 30° C. and about 70° C. For example, when the first solution includes about 40% by weight epoxy resin and about 10% by weight silicone, the first solution may have a viscosity of about 2125 mPa·s at a temperature of about 30° C. and a viscosity of about 280 mPa·s at a temperature of about 60° C. Thus, the characteristics of the first solution may be that when a temperature is raised twice (e.g., to be two times the temperature), a viscosity of the first solution may be reduced much more than twice, for example, about 7.6 times. According to an exemplary embodiment, in a temperature range between about 30° C. and about 60° C., each time a temperature increases by as much as about 1° C., the viscosity of the first solution is reduced by as much as about 61.5 mPa·s. For example, the first solution may have a relatively high viscosity and a relatively low flowability at a temperature below a set first temperature. For example, when the set first temperature is about 40° C. and the temperature of first solution is between about 30° C. and about 39° C., the viscosity of the first solution is a value ranging from about 2125 mPa·s to about 1571.5 mPa·s. Alternatively, the first solution may have a relatively low viscosity and a relatively high flowability at the temperature equal to or higher than the set first temperature. For example, when the set first temperature is about 40° C. and the temperature of first solution is between about 40° C. and about 50° C., the viscosity of the first solution is a value ranging from about 1510 mPa·s to about 895 mPa·s. Characteristics of the first solution will be described in detail later with reference to FIG. 7.

In an exemplary embodiment, the dam 310 having a desired shape may be formed by using the first nozzle N1 having a relatively smaller diameter and injecting a first solution having a relatively high viscosity and a relatively low temperature as described above. For example, during the process of forming the dam 310, a first solution having a viscosity of about 2125 mPa·s at a temperature of about 30° C. may be sprayed via the first nozzle N1 in an area surrounding the semiconductor chip mounting region I.

In some embodiments, the order of mounting of the semiconductor chip 220 and the order of formation of the dam 310 may be changed. For example, after the semiconductor chip 220 is mounted on the package substrate 100, the dam 310 may be formed. Alternatively, after the dam 310 is formed, the semiconductor chip 220 may be mounted on the package substrate 100. The order of mounting of the semiconductor chip 220 and the order of formation of the dam 310 may be selected in consideration of other general conditions (e.g., the arrangement of the passive devices 120 and the external connection terminal 130 and process conditions for curing the first solution).

In some embodiments, referring to FIGS. 4A and 4B, a region under the semiconductor chip 220 and a region defined by the dam 310 may be filled with the underfill 320.

Occasionally, a gap may be formed between the package substrate 100 and the semiconductor chip 220 during a process of electrically connecting the connection member 210 and the semiconductor chip 220. The gap may degrade reliability of connection between the semiconductor chip 220 and the package substrate 100. According to this exemplary embodiment, the underfill 320 may be injected into the gap to reinforce connection between the semiconductor chip 220 and the package substrate 100.

The formation of the underfill 320 may include locating the second nozzle N2 between the semiconductor chip 220 and the dam 310 and spraying a first solution having a relatively high temperature (e.g., a temperature equal to higher than about 50° C., but not limited thereto) via the second nozzle N2, and the first solution may be injected under the semiconductor chip 220. During this process, the underfill 320 including the first solution may overflow into the peripheral region, but the dam 310 surrounding the semiconductor chip mounting region I may prevent the underfill 320 from overflowing into the peripheral region in which the passive device 120 and the external connection terminals 130 are located. Thus, the passive device 120 and the external connection terminals 130 may be protected from the overflow of the underfill 320. The process of filling the gap between the package substrate 100 and the semiconductor chip 220 with the underfill 320 may be performed by using the first solution having a relatively lower viscosity than when the dam 310 is formed.

In particular, extensive experimentations were carried out to test for optimal viscosity of the first solution for forming the dam 310 and the underfill 320 having desired characteristics. Some examples of the experiments are described below.

For example, in a first experiment, during the process of filling the gap between the package substrate 100 and the semiconductor chip 220 with the underfill 320, a first solution having a viscosity of about 895 mPa·s at a temperature of about 50° C. was deposited under the semiconductor chip 220 via the second nozzle N2. During the process of forming the dam 310, a first solution having a viscosity of about 2125 mPa·s at a temperature of about 30° C. was deposited via the first nozzle N1 in an area surrounding the semiconductor chip mounting region I.

In a second experiment, during the process of filling the gap between the package substrate 100 and the semiconductor chip 220 with the underfill 320, a first solution having a viscosity of about 280 mPa·s at a temperature of about 60° C. was deposited under the semiconductor chip 220 via the second nozzle N2. During the process of forming the dam 310, a first solution having a viscosity of about 1510 mPa·s at a temperature of about 40° C. was deposited via the first nozzle N1 in an area surrounding the semiconductor chip mounting region I.

With the miniaturization and an increase in the functionality of electronic products, a high-density mounting process has become useful for a packaging technique of mounting the semiconductor chip 220. Thus, a width of a gap between the package substrate 100 and the semiconductor chip 220 has also been gradually shrinking to accommodate high-density mounting of the semiconductor chip 220. When the first solution is sprayed, occasionally, the gap may be filled with the first solution due to a capillarity phenomenon. For example, when the first solution has a relatively low viscosity (e.g., a viscosity between about 280 mPa·s at a temperature of about 60° C. to about 895 mPa·s at a temperature of about 50° C.), it may be relatively easy to inject the underfill 320. However, although the first solution having the low viscosity easily fills the gap between the package substrate 100 and the semiconductor chip 220, the first solution having the low viscosity may also easily overflow into the peripheral region. Therefore, by forming the dam 310 with a first solution having a relatively high viscosity (e.g., a viscosity between about 2125 mPa·s at a temperature of about 30° C. to about 1510 mPa·s at a temperature of about 40° C.) around the semiconductor chip mounting region I, the underfill 320 having a low viscosity may be prevented from overflowing into the passive devices 120 and the external terminals 130 located in the peripheral region.

In some embodiments, after the dam 310 and the underfill 320 are formed, a process of curing the dam 310 and the underfill 320 may be performed. The curing process may be performed by using a different method at a different temperature according to physical properties of the first solution included in the dam 310 and the underfill 320. The curing process may be performed by using a one-time process after both the dam 310 and the underfill 320 are formed. For example, since the dam 310 and the underfill 320 may be formed by using the same first solution (e.g., having the same composition and ratio of materials), the dam 310 and the underfill 320 may be cured at the same second temperature.

The second temperature at which the curing process is performed may be higher than the set first temperature and also higher than a temperature of the first solution measured during a process of forming the dam 310 and the underfill 320. For example, the second temperature may be in the range of about 65° C. to about 85° C. In some embodiments, the curing process may be performed by using ultraviolet (UV) light or a laser, but the embodiments are not limited thereto.

When the curing process is finished, the dam 310 and the underfill 320 may be unified with each other so that there may be no interface between the dam 310 and the underfill 320. For example, unlike a case in which a dam and an underfill are formed by using respectively different solutions, generation of air bubbles and interfacial defects may be reduced at a junction surface between the dam 310 and the underfill 320.

A method of manufacturing a semiconductor package according to an embodiment may help prevent a failure in the outer appearance of the semiconductor package due to a blur of an underfill 320, the spread of an injected underfill 320 to the surface of a package substrate 100, and a shortage of the underfill 320 in a gap between a semiconductor chip 220 and the package substrate 100 due to the spread of the underfill 320 to the surface of the package substrate 100. Furthermore, since a dam 310 and the underfill 320 are formed by using the same first solution, a curing process may be performed only once, thus enabling process simplicity and a reduction of manufacturing costs.

In the method of manufacturing the semiconductor package according to this embodiment, the underfill 320 may be prevented from overflowing into the peripheral region of the package substrate 100 so that failures in the semiconductor package may be reduced and connection reliability may be increased.

Figure 5B:
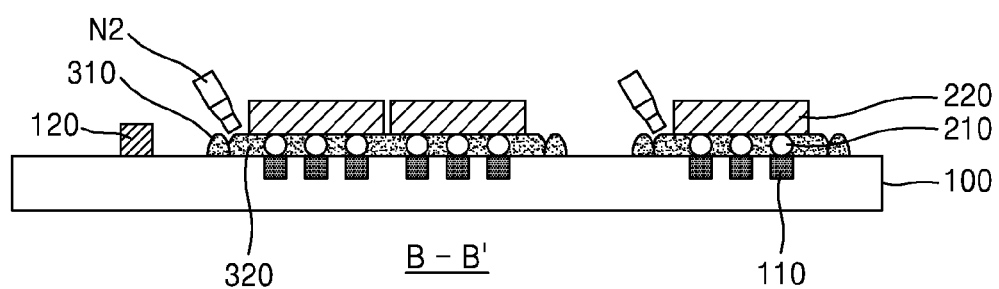

FIGS. 5A and 5B are a plan view and side view of a method of manufacturing a semiconductor package according to an exemplary embodiment.

FIGS. 5A and 5B illustrate an example in which a package substrate 100 in which at least two semiconductor chip mounting regions I are spaced apart from one another may be filled with an underfill 320.

As described above, a plurality of semiconductor chips 220 having different characteristics may be included in one semiconductor package. The semiconductor chips 220 may be spaced apart from one another according to the designs of a substrate pad 110 and a circuit pattern. In this exemplary embodiment, the underfill 320 may be formed in separate regions (e.g., two or more separate regions having differing surface areas, but not limited thereto). In an alternative embodiment, all regions may have equal surface areas. The regions may be horizontally separated from each other, for example, where no underfill is formed.

In some embodiments, a dam 310 surrounding the semiconductor chips 220 may form a plurality of closed curves. After the dam 310 is respectively formed around each of the semiconductor chip mounting regions I, the underfill 320 may be formed. Alternatively, after both the dam 310 and the underfill 320 are formed in one semiconductor chip mounting region I, both the dam 310 and the underfill 320 may be formed in another semiconductor chip mounting region I.

Since processes of forming the dam 310 and the underfill 320 are the same as described above, detailed descriptions thereof are omitted.

Figure 6:
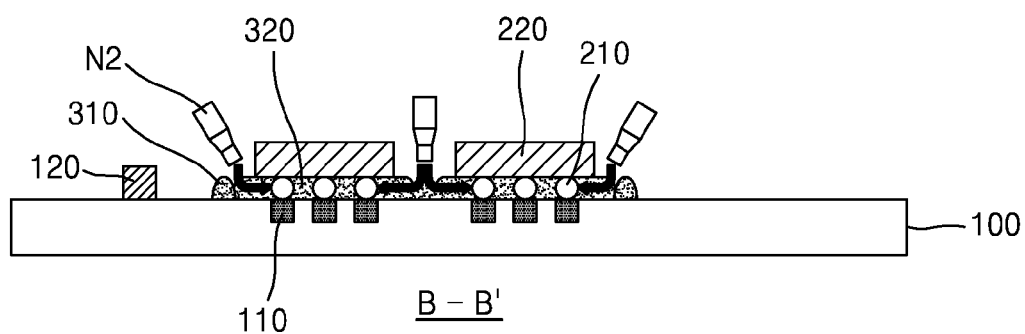
FIG. 6 is a schematic view showing the flow of a first solution used in a method of manufacturing a semiconductor package according to an exemplary embodiment.

FIG. 6 is a schematic view showing the flow of a first solution used in a method of manufacturing a semiconductor package according to an exemplary embodiment.

FIG. 6 schematically illustrates the flow of the first solution when an underfill 320 is injected by using a plurality of second nozzles N2. As compared with a process of filling the underfill 320 by using one second nozzle N2, the underfill 320 may be injected by shortening a process time. Thus, occurrence of air traps due to a temperature difference caused by a time duration for which the underfill 320 is injected may be prevented, and productivity of a semiconductor package may be increased.

The second nozzle N2 may spray the first solution not only on a region between the semiconductor chip 22 and the dam 310 but also on a region between the semiconductor chips 220. In some embodiments, the first solution may be sprayed not in one direction but in several directions. Also, the spraying of the first solution via the second nozzle N2 may be simultaneously performed in several directions or sequentially performed.

Figure 7:
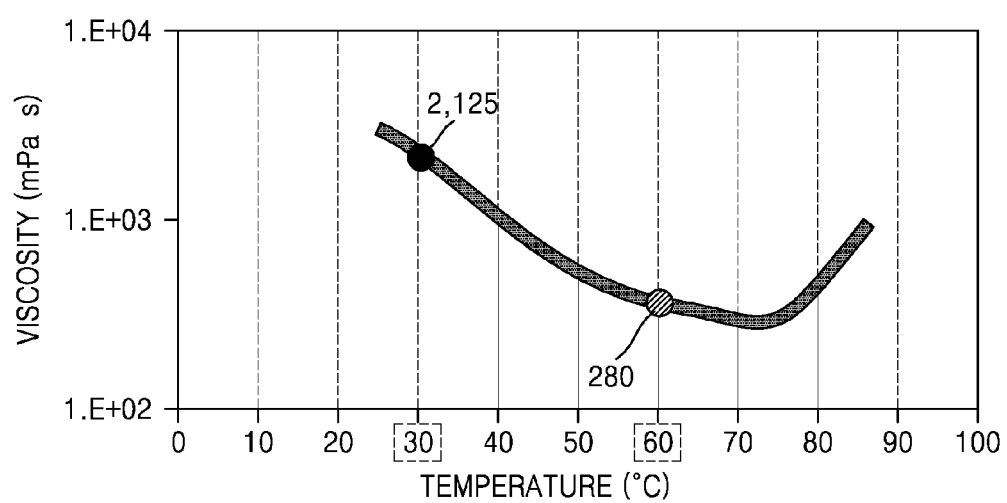
FIG. 7 is a graph of a temperature and viscosity of a first solution used in a method of manufacturing a semiconductor package according to an exemplary embodiment.

FIG. 7 is a graph of a temperature and viscosity of a first solution used in a method of manufacturing a semiconductor package according to an embodiment.

FIG. 7 is a graph of the viscosity of the first solution relative to the temperature of the first solution. In general, an underfill 320 (e.g., as illustrated in FIG. 4B) may be a liquid resin that has a predetermined viscosity and is capable of being cured at a predetermined temperature. In an embodiment, the first solution may include about 40% by weight epoxy resin and about 10% by weight silicone. The viscosity of the first solution may greatly vary according to the temperature thereof.

Specifically, a set first temperature may range from about 40° C. to about 50° C. Also, a set first viscosity may range from about 1000 mPa·s to about 1500 mPa·s. The set first temperature and the set first viscosity may vary according to a type of the first solution used in this exemplary embodiment.

When a dam 310 (e.g., as illustrated in FIG. 3B) is formed by using the first solution at a temperature (i.e., a low temperature of about 30° C.) below the set first temperature, the viscosity of the first solution may range from about 1000 mPa·s to about 100000 mPa·s (e.g., in one embodiment, when the set first temperature is about 40° C. and the temperature of first solution is between about 30° C. and about 39° C., the viscosity of the first solution is a value ranging from about 2125 mPa·s at a temperature of about 30° C. to about 1571.5 mPa·s at a temperature of about 39° C.), so the first solution may have relatively low flowability and may not spread on a package substrate 100 but may maintain a dam shape for a predetermined time. When the underfill 320 is formed by using the first solution at a temperature (i.e., a high temperature of about 60° C.) equal to or higher than the set first temperature, the viscosity of the first solution may range from about 0 mPa·s to about 1000 mPa·s. (e.g., when the set first temperature is about 40° C. and the temperature of first solution is between about 50° C. and about 60° C., the viscosity of the first solution is a value ranging from about 895 mPa·s. at a temperature of about 50° C. to about 280 mPa·s at a temperature of about 60° C.), so the first solution may have relatively high flowability without causing voids or incomplete filling during the formation of the underfill.

The ranges of the temperature and viscosity of the first solution may vary according to a kind and forming method of the semiconductor package within permitted limits. In some embodiments, the curing process is performed within a certain time period after injecting the underfill. For example, a time period can be selected so that curing occurs quickly enough after depositing the underfill to prevent the dam from heating to the temperature of the underfill.

Figure 8:
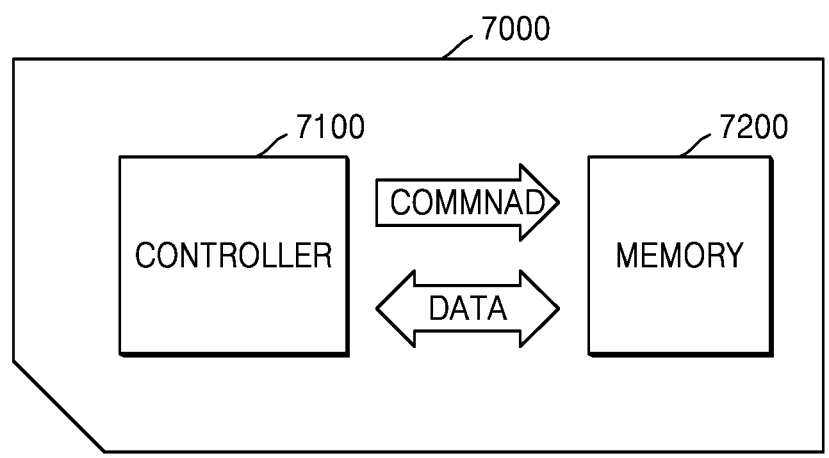
FIG. 8 is a schematic block diagram of a memory card including a semiconductor package manufactured by using a method of manufacturing a semiconductor package according to an exemplary embodiment.

FIG. 8 is a schematic block diagram of a memory card 7000 including a semiconductor package manufactured by using a method of manufacturing a semiconductor package according to an exemplary embodiment.

Referring to FIG. 8, in the memory card 7000, a controller 7100 and a memory 7200 may be located to exchange electric signals. For example, when the controller 7100 issues a command, the memory 7200 may transmit data. The controller 7100 and/or the memory 7200 may include a semiconductor package according to one of the embodiments as described above. The memory 7200 may include a memory array (not shown) or a memory array bank (not shown).

The memory card 7000 may be used for memory devices, for example, various kinds of cards, such as a memory stick card, a smart media (SM) card, a secure digital (SD) card, a mini SD card, or a multimedia card (MMC).

Figure 9:
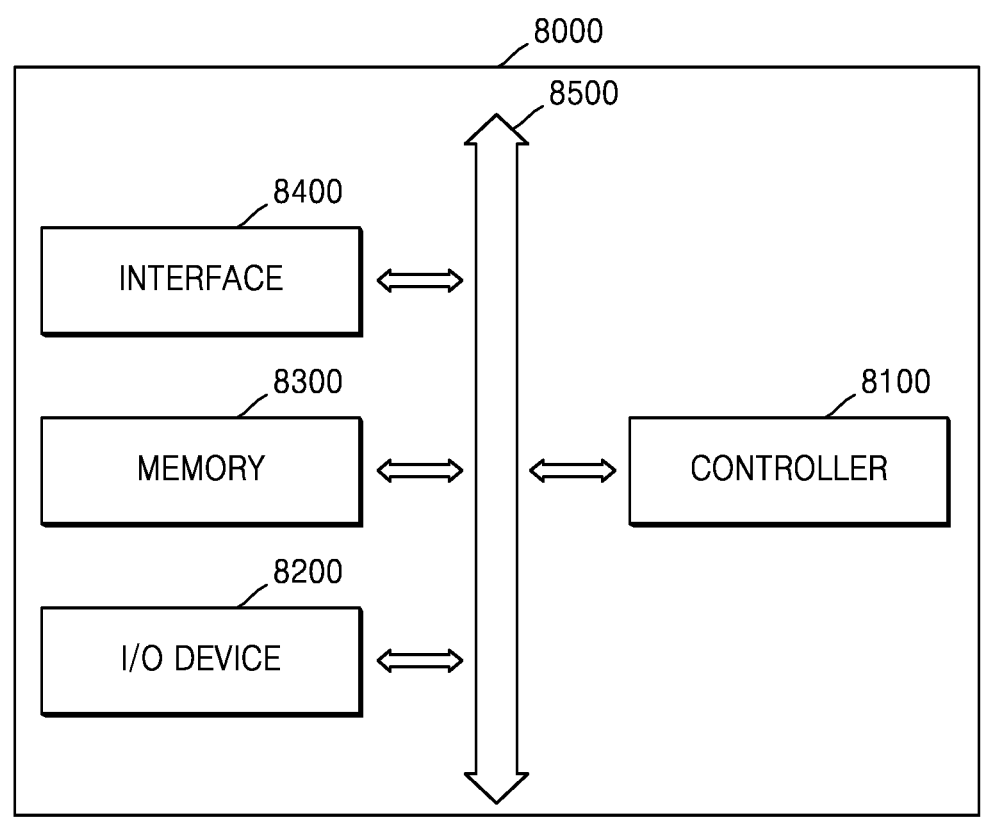
FIG. 9 is a schematic block diagram of an electronic system including a semiconductor package manufactured by using a method of manufacturing a semiconductor package according to an exemplary embodiment.

FIG. 9 is a schematic block diagram of an electronic system 8000 including a semiconductor package manufactured by using a method of manufacturing a semiconductor package according to an exemplary embodiment.

Referring to FIG. 9, the electronic system 8000 may include a controller 8100 (e.g., control circuitry), an input/output (I/O) device 8200, a memory 8300, and an interface 8400. The electronic system 8000 may be a mobile system or a system configured to transmit or receive information. In some embodiments, the mobile system may be a portable computer, a web tablet, a wireless phone, a mobile phone, a digital music player, or a memory card.

In some embodiments, the controller 8100 may serve to execute a program and control the electronic system 8000. The controller 8100 may be, for example, an MP, a DSP, an MC, or a similar device thereto. The I/O device 8200 may be used to input or output data to or from the electronic system 8000.

In some embodiments, the electronic system 8000 may be connected to an external apparatus (e.g., a personal computer (PC) or a network) by using the I/O device 8200 and exchange data with the external apparatus. The I/O device 8200 may be, for example, a keypad, a keyboard, a display, or a touch screen. The memory 8300 may store codes and/or data for operations of the controller 8100 or store data processed by the controller 8100. At least one of the controller 8100 and the memory 8300 may include a semiconductor package according to one of the embodiments as described above. The interface 8400 may be a data transmission path between the electronic system 8000 and another external apparatus. The controller 8100, the I/O device 8200, the memory 8300, and the interface 8400 may communicate with one another via a bus 8500.

For example, the electronic system 8000 may be used for a mobile phone, a digital music player, a navigation device, a portable multimedia player (PMP), a solid-state disk (SSD), or a household appliance.

Figure 10:
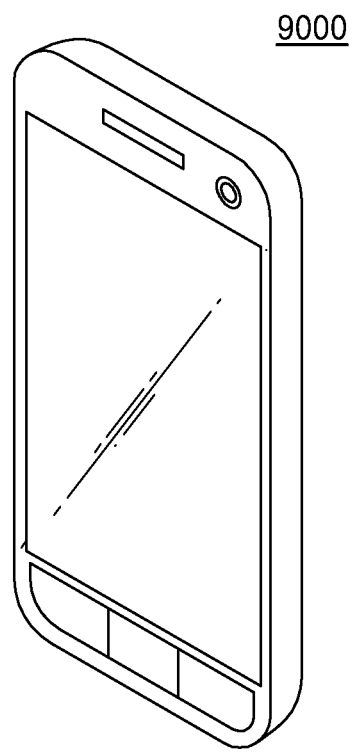
FIG. 10 is a schematic cross-sectional view of an example of applying a semiconductor package manufactured by using a method of manufacturing a semiconductor package according to an exemplary embodiment to an electronic device.

FIG. 10 is a schematic cross-sectional view of an example of applying a semiconductor package manufactured by using a method of manufacturing a semiconductor package according to an exemplary embodiment to an electronic device.

FIG. 10 illustrates an example of applying an electronic system 8000 of FIG. 9 to a mobile phone 900. In addition, the electronic system 8000 may be also applied to a portable laptop computer, a digital music player, a navigation device, an SSD, a household appliance, or an automobile.

Therefore, the descriptions proposed herein are just example embodiments for the purpose of illustrations only, not intended to limit the scope of the inventive concept, so it should be understood that other equivalents and modifications could be made thereto without departing from the spirit and scope of the inventive concept.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
    preparing a package substrate including a semiconductor chip mounting region;
    mounting a semiconductor chip in the semiconductor chip mounting region;
    forming a dam surrounding the semiconductor chip by depositing a first solution having a temperature below a set first temperature; and
    filling a region under the semiconductor chip and a region defined by the dam with an underfill by depositing the first solution having a temperature equal to or higher than the set first temperature.

2. The method of claim 1, wherein the set first temperature is a temperature having a value in the range from about 40° C. to about 50° C.

3. The method of claim 2, wherein a viscosity of the first solution used for forming the dam at the temperature below the set temperature is higher than a viscosity of the first solution used for filling the region under the semiconductor chip and the region defined by the dam with the underfill at a temperature equal to or higher than the set first temperature.

4. The method of claim 1, wherein the first solution is deposited via a nozzle, and
a diameter of a first nozzle configured to deposit the first solution at the temperature below the set first temperature is smaller than a diameter of a second nozzle configured to deposit the first solution at the temperature equal to or higher than the set first temperature.

5. The method of claim 4, wherein a start point of the dam contacts an end point of the dam.

6. The method of claim 4, wherein a plurality of second nozzles are provided, and the method further comprises simultaneously depositing the first solution via at least one of the plurality of second nozzles.

7. The method of claim 6, wherein the method comprises depositing the first solution between the semiconductor chip and the dam via at least one of the plurality of second nozzles, and depositing the first solution between the semiconductor chips via the remaining second nozzles.

8. The method of claim 1, wherein the dam is spaced apart from the semiconductor chip.

9. The method of claim 1, further comprising, after the filling of the region under the semiconductor chip and the region defined by the dam with the underfill, curing the dam and the underfill.

10. The method of claim 9, wherein the curing of the dam and the underfill comprises applying a constant second temperature to the dam and the underfill simultaneously.

11. The method of claim 10, wherein the constant second temperature has a value in a range from about 60° C. to about 80° C.

12. The method of claim 1, wherein the viscosity of the first solution is inversely proportional to the temperature of the first solution when the temperature of the first solution ranges from about 30° C. and about 70° C.

13. The method of claim 12, wherein, when the set first temperature is about 40° C. and the temperature of first solution is between about 39° C. and about 30° C., the viscosity of the first solution is a value that ranges from about 1571.5 mPa s to about 2125 mPa·s.

14. The method of claim 1, wherein the first solution includes about 40% by weight epoxy resin and about 10% by weight silicone.

15. A method of manufacturing a semiconductor package, the method comprising:
preparing a package substrate having a semiconductor chip mounting region, the package substrate including a substrate pad formed inside of the semiconductor chip mounting region of the package substrate;
forming a dam to surround the semiconductor chip mounting region, wherein the forming of the dam includes using a first solution while a viscosity of the first solution is equal to or higher than a set first viscosity;
mounting a semiconductor chip in the semiconductor chip mounting region, wherein the mounting of the semiconductor chip includes electrically connecting the semiconductor chip to the substrate pad; and
filling a region under the semiconductor chip and a region defined by the dam with an underfill by using the first solution while the viscosity of the first solution is below the set first viscosity.

16. The method of claim 15, wherein the set first viscosity has a value in a range from about 1000 mPa·s to about 1500 mPa·s, and
the viscosity of the first solution varies according to temperature.

17. The method of claim 16, wherein the first solution comprises a material containing at least one selected from the group consisting of an epoxy resin, a phenol resin, and a silicone-based material.

18. The method of claim 15, wherein the dam comprises at least one closed curve.

19. The method of claim 18, wherein the filling of the region under the semiconductor chip and the region defined by the dam with the underfill comprises filling the at least one closed curve with the underfill.

20. The method of claim 15, further comprising simultaneously curing the dam and the underfill by applying a constant temperature.

21. The method of claim 15, further comprising:
forming the dam surrounding the semiconductor chip by using the first solution having a temperature below a set first temperature; and
filling the region under the semiconductor chip and a region defined by the dam with the underfill by using the first solution having a temperature equal to or higher than the set first temperature.

22. A method of manufacturing a semiconductor package, the method comprising:
preparing a package substrate having a semiconductor chip mounting region, the package substrate including a substrate pad formed inside of the semiconductor chip mounting region of the package substrate;
forming a raised portion to surround the semiconductor chip mounting region, wherein the forming of the raised portion includes depositing a first solution while a temperature of the first solution is lower than a set first temperature and while a viscosity of the first solution is equal to or higher than a set first viscosity;
mounting a semiconductor chip in the semiconductor chip mounting region, wherein the mounting of the semiconductor chip includes electrically connecting the semiconductor chip to the substrate pad; and
filling a region under the semiconductor chip and a region defined by the raised portion with an underfill by depositing the first solution while the temperature of the first solution is equal to or higher than the set first temperature and while the viscosity of the first solution is below the set first viscosity.

23. The method of claim 22, further comprising simultaneously curing the raised portion and the underfill by applying a constant second temperature higher than the set first temperature.

24. The method of claim 22, wherein the set first viscosity has a value in a range from about 1000 mPa·s to about 1500 mPa·s.

25. The method of claim 22, wherein the set first temperature has a value in a range from bout 40° C. to about 50° C.

* * * * *